United States Patent
Schillebeeckx et al.

(10) Patent No.: US 12,207,032 B2
(45) Date of Patent: Jan. 21, 2025

(54) MICROPHONE SYSTEM AND METHODS

(71) Applicant: Freedman Electronics Pty Ltd, Silverwater (AU)

(72) Inventors: Pieter Schillebeeckx, Silverwater (AU); Dominik Peklo, Silverwater (AU)

(73) Assignee: Freedman Electronics Pty Ltd, Silverwater (AU)

( * ) Notice: Subject to any disclaimer, the term of this patent is extended or adjusted under 35 U.S.C. 154(b) by 7 days.

(21) Appl. No.: 17/525,615

(22) Filed: Nov. 12, 2021

(65) Prior Publication Data

US 2023/0156385 A1    May 18, 2023

(51) Int. Cl.
 *H04R 1/04*  (2006.01)
 *G06F 3/16*  (2006.01)
 *H03M 1/02*  (2006.01)

(52) U.S. Cl.
 CPC ............. *H04R 1/04* (2013.01); *G06F 3/162* (2013.01); *H03M 1/02* (2013.01)

(58) Field of Classification Search
 None
 See application file for complete search history.

(56) References Cited

U.S. PATENT DOCUMENTS

| | | | | |
|---|---|---|---|---|
| 9,749,725 | B2* | 8/2017 | Naito | H04R 1/04 |
| 2005/0276007 | A1* | 12/2005 | Fan | G06F 1/184 |
| | | | | 361/679.58 |
| 2006/0013428 | A1* | 1/2006 | Akino | H04R 19/04 |
| | | | | 381/369 |
| 2006/0215856 | A1* | 9/2006 | Meyer | H04R 3/00 |
| | | | | 381/113 |
| 2016/0142802 | A1* | 5/2016 | Naito | H04R 1/04 |
| | | | | 381/361 |
| 2020/0162805 | A1* | 5/2020 | Lesso | H04R 1/08 |
| 2021/0160611 | A1* | 5/2021 | Balgemann | H04R 1/08 |

OTHER PUBLICATIONS

VideoMic NTG (https://web.archive.org/web/20200308183014/https://vmntg.rode.com/) (archived Mar. 8, 2020) (last accessed May 2, 2023) ("Røde") (Year: 2020).*

* cited by examiner

*Primary Examiner* — Walter F Briney, III
(74) *Attorney, Agent, or Firm* — Lathrop GPM LLP; Richard Beem; Alex Shtraym

(57) ABSTRACT

The present invention relates generally to the field of microphones, and more particularly to a microphone including an analog port and a digital port through which audio may be output. The microphone may be configured to obtain power from a host device and may include circuitry for selectively routing audio signals to the one or more ports. Advantageously, the microphone may be configured to connect with a variety of host devices and may facilitate functioning as a USB microphone via the digital port, while the analog port may be used as a headphone output.

20 Claims, 7 Drawing Sheets

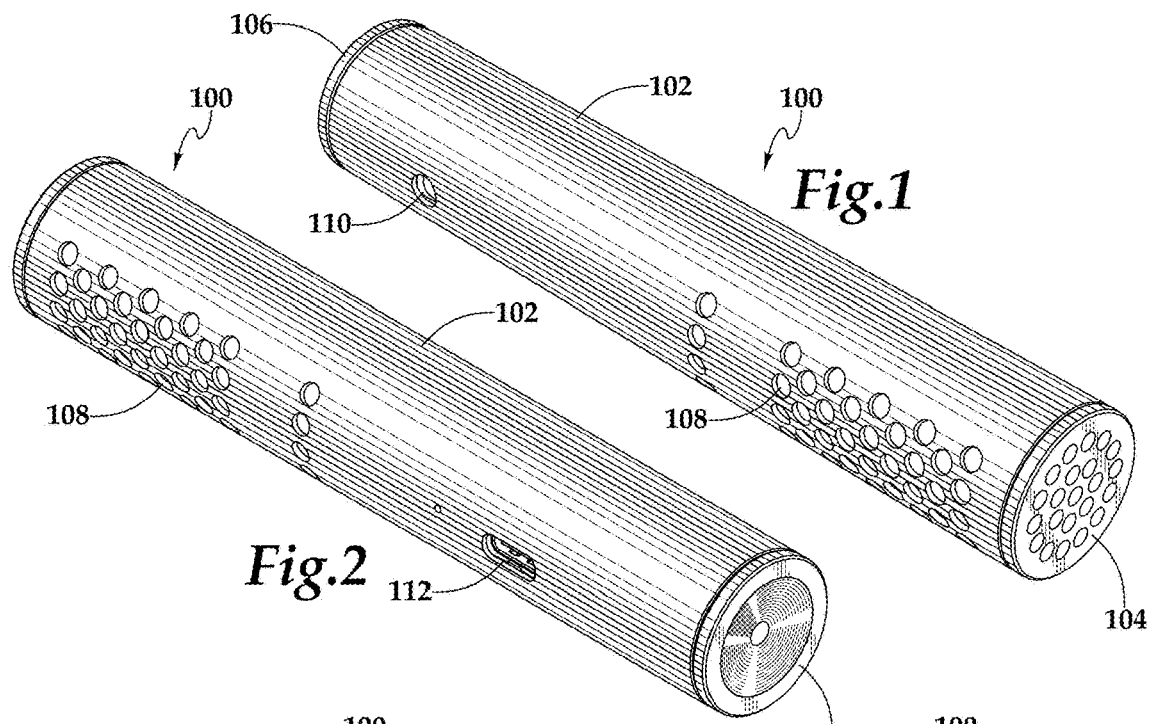
Fig.1
Fig.2
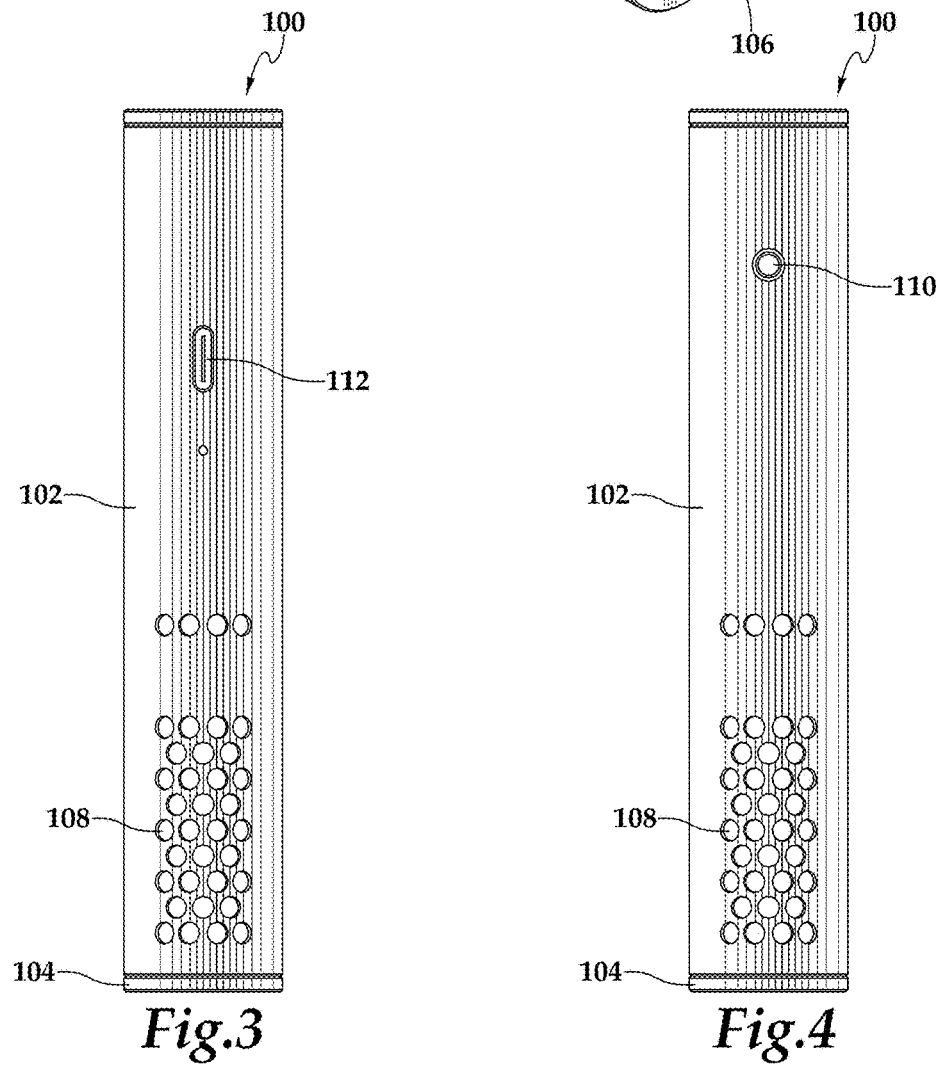
Fig.3
Fig.4

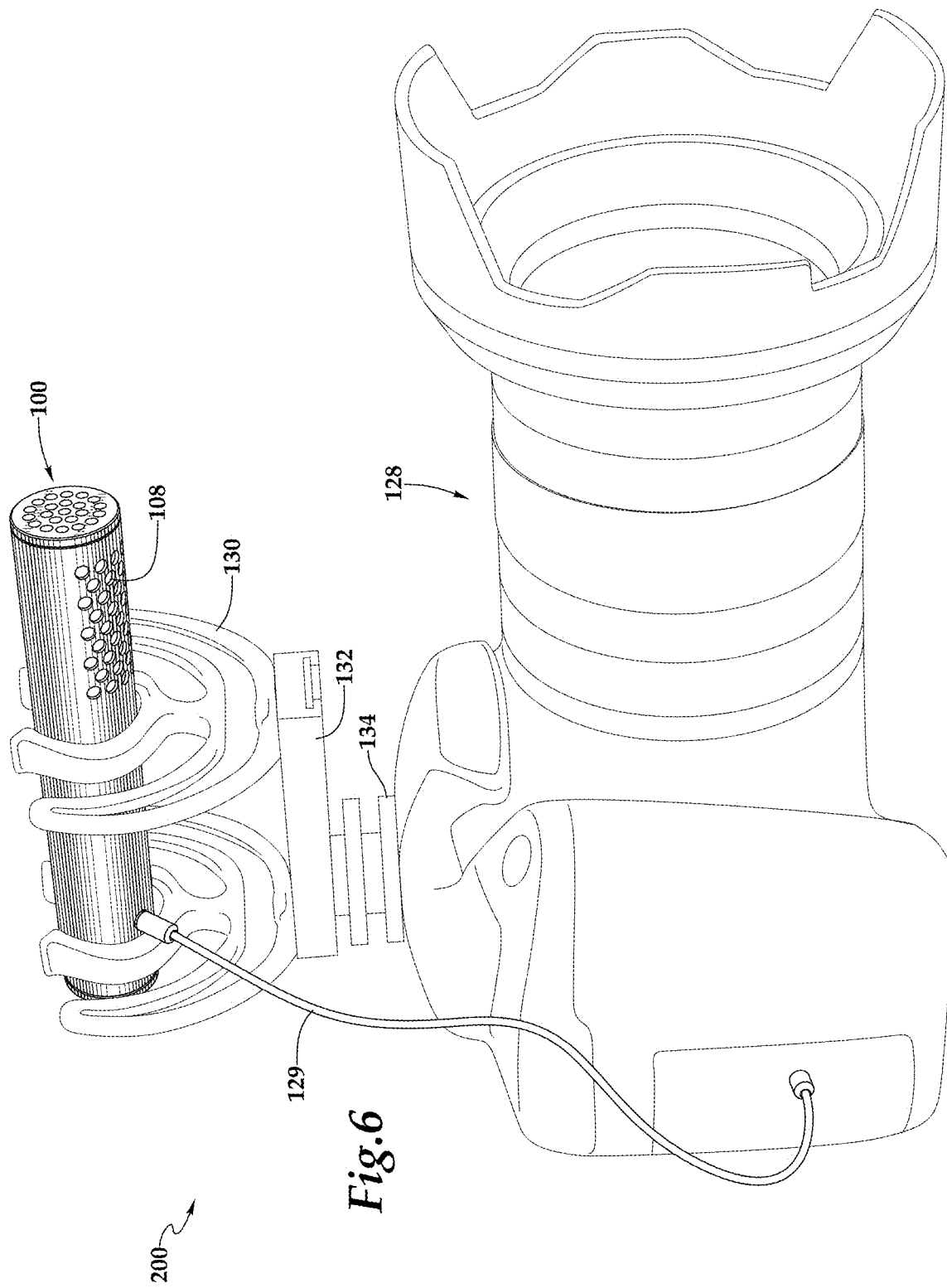

MICROPHONE SYSTEM AND METHODS

FIELD OF THE INVENTION

The present invention relates generally to the field of microphones, and more particularly to a microphone system and methods for selectively routing audio signals.

BACKGROUND

Microphones, such as directional microphones, are widely used in various applications such as news gathering, sporting events, outdoor film recording, and outdoor video recording. Once audio is captured, it can be output to one or more devices via a wireless or wired connection.

Wired microphones typically include an audio interface for outputting the audio to another device. For example, conventional microphones may include an optical interface, a high definition multimedia interface (HDMI), a universal serial bus (USB), a three-pin external line return (XLR), a tip and sleeve (TS) connector, a tip, ring, and sleeve (TRS) connector, and the like.

To accommodate for the variety of audio connectors in the market, certain microphones may include a plurality of analog and/or digital interfaces. However, such microphones are typically configured to output audio via only one interface at a time, such that the remaining interfaces are inoperable. Microphones with a number of interfaces also may require a user to manually select the interface through which audio is output. Moreover, wired microphones that utilize an analog input often rely on the host device to enhance the sound and performance of the audio.

Conventional microphones typically require a battery to store and provide power. When the battery is low or out of power, charging the battery is required to allow continued usage. In addition, if the user wishes to output audio through a wireless connection, such connection may be impossible to perform when the battery of the microphone is depleted and thereby renders the microphone nonfunctional.

Therefore, there is a need for a microphone that is configured to selectively route audio signals to each available interface for improved functionality over traditional prior art microphones. The present invention satisfies this need.

SUMMARY

The present invention relates generally to the field of microphones, and more particularly to a microphone system and methods for selectively routing audio signals to one or more ports for output.

In one aspect, the microphone may operate in a default configuration. In the default configuration, a capsule of the microphone may be directly connected to an analog port, such as a 3.5 mm TRS connector. A host device may connect via the analog port such that power is provided to the capsule from the host device and an audio signal is directly routed from the capsule to the host device. For example, the power provided to the capsule may be a standard 2-5 volt DC power that most cameras and computing devices with a 3.5 mm input provide as a biasing voltage for small microphone capsules and other peripherals.

In another aspect, the microphone may be configured to switch from the default configuration in response to detecting a connection via a digital port of the microphone. When a host device, such as a computer, tablet or mobile device, is connected via a digital port, the microphone may operate as a USB microphone. In other words, USB circuitry of the microphone may be powered and audio signals may be routed through the digital port to the host device digitally.

In addition, when switched from the default configuration, the analog port may be used as a headphone output, which may facilitate providing enhanced audio. For example, the audio routed from the microphone to the host device may be amplified through processing circuitry to provide a high-level output to a user. As a result of switching from the default configuration, the microphone may facilitate both inputting and outputting audio signals to, for example, provide audio recording along with two-way communications, such through internet-based applications including Zoom, Microsoft Teams, Skype, and the like.

In yet another aspect, audio signals may be selectively routed via a switching circuit of the microphone. Switching circuitry may include one or more semiconductor switches, such as a Complementary Metal Oxide-Semiconductor (CMOS), that are configured to normally closed (i.e., in a default configuration) when no connection is made via the digital port.

When switching circuitry is in the normally closed position, audio signals may be routed from the capsule directly to a second switch. The second switch may also be normally closed such that audio signals pass directly to the analog port. In other words, when both switches are in a normally closed position, the microphone capsule is configured to receive power via the analog port, and audio signals from the capsule are routed directly to the analog port for output to the host device.

In response to detecting a connection via a digital port, switching circuitry may change to a normally open position. In the normally open position, audio signals from the capsule are routed to processing circuitry, which may include an analog-to-digital converter, a digital-to-analog converter, a digital signal processor, and other audio signal processing circuitry. Once processed, a digital audio signal may be routed to the host device via the digital port. In addition, the audio signal may be routed to the second switch and through to the analog port, which may output audio from the microphone or from the host device to a headphone.

It yet a further aspect, when switching circuitry is in a normally open position, since the capsule is no longer connected directly to the second switch, a separate capsule biasing voltage may be generated and applied directly to the capsule as there is no plugin-power present. Moreover, the processing circuitry also may include a microprocessor for audio signal processing to enhance the sound and performance of the microphone when connected to a host device via the digital port.

While the invention is susceptible to various modifications and alternative forms, specific exemplary embodiments thereof have been shown by way of example in the drawings and have herein been described in detail. It should be understood, however, that there is no intent to limit the invention to the particular embodiments disclosed, but on the contrary, the intention is to cover all modifications, equivalents, and alternatives falling within the scope of the invention as defined by the appended claims.

BRIEF DESCRIPTION OF THE DRAWINGS

Embodiments are illustrated by way of example and not limitation in the figures in the accompanying drawings, in which like references indicate similar elements and in which:

FIG. 1 illustrates a front perspective view of an exemplary microphone;

FIG. 2 illustrates a rear perspective view of the microphone of FIG. 1;

FIG. 3 illustrates a side view of the microphone of FIG. 1 including a digital port;

FIG. 4 illustrates a side view of the microphone of FIG. 1 including an analog port;

FIG. 6 illustrates a perspective view of the microphone of FIG. 1 and an exemplary environment;

DETAILED DESCRIPTION OF THE INVENTION

Figure 5:
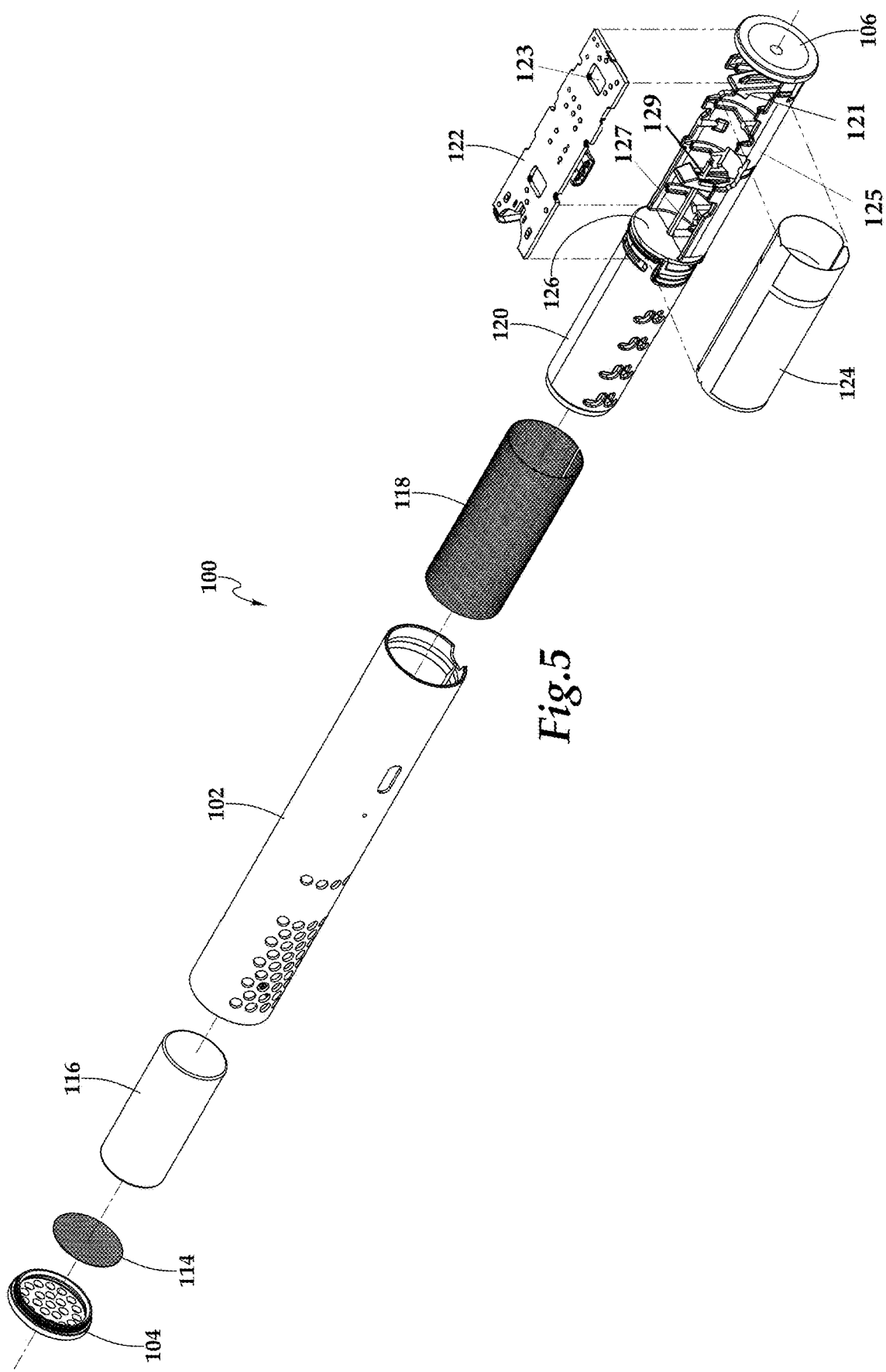
FIG. 5 illustrates an exploded view of the microphone of FIG. 1.

The present invention relates generally to the field of microphones, and more particularly to a microphone including an analog port and a digital port through which audio may be output. The microphone may be configured to obtain power from a host device and may include circuitry for selectively routing audio signals to the one or more ports. Advantageously, the microphone may be configured to connect with a variety of host devices and may facilitate functioning as a USB microphone via the digital port, while the analog port may be used as a powerful headphone output Turning now to the drawings wherein like numerals represent like components, FIGS. 1-5 illustrate an exemplary microphone 100. As shown, microphone 100 has a body 102, a front cap 104, and a rear cap 106. Body 102 and front cap 104 may include one or more openings 108 to permit sound waves to enter. While body 102 is shown to be substantially tubular, other shapes are contemplated.

Although microphone 100 is not limited to specific dimensions, the length of body 102 may range between about one hundred millimeters and about two hundred millimeters and preferably between about one hundred and fifty millimeters and about one hundred and eighty millimeters. In one embodiment, body 102 is about one hundred and seventy millimeters in length. The diameter of body 102 may range between about ten millimeters and about thirty millimeters and preferably between about fifteen millimeters and about twenty five millimeters. In one embodiment, the diameter of body 102 is about twenty one millimeters.

As shown in FIGS. 1-4, body 102 of microphone may include audio connectors. In particular, body 102 may include an analog port 110 and a digital port 112. Analog port 110 may include, for example, a tip-sleeve (TS) connector, a tip-ring-sleeve (TSR) connector, a tip-ring-ring-sleeve (TRRS) connector, an RCA connector, an XLR connector, and the like. Preferably, analog port 110 is a 3.5 mm TRS connector. Digital port 112 may include, for example, an RCA connector, a High-Definition Multimedia Interface (HDMI) connector, a DisplayPort connector, and the like. Preferably, digital port connector 112 is a USB or USB-C type connector.

FIG. 5 illustrates an exploded view of microphone 100. As shown, components of microphone 100 may be housed between front cap 104 and rear cap 106 within body 102. Specifically, microphone 100 may include a front mesh 114, a line tube foam 116, side mesh 118, a spine assembly 120, a printed circuit board (PCB) 122, and line tube fabric 124.

Front mesh 114 and side mesh 118 of microphone 100 may be formed of one or more layers, More specifically, the one or more mesh layers may be used to adjust the acoustic impedance properties of microphone 100 and may prevent intrusion of foreign matter and fine particles. Examples of mesh materials that may be used include nonmetallic (e.g., nonconductive) materials such as woven polyester and PVC-on-polyester fabrics or metallic materials such as stainless steel. In general, mesh material may be formed from any suitable fabric material that exhibits acceptable acoustic performance, such as for example, sound transparency of 90% or more.

Line tube foam 116 may include a polyurethane foam, a dense fiber material or other material sufficient to exhibit sound absorbing properties. As shown, microphone 100 may further include line tube fabric 124 to form a protective barrier against a penetration of particles.

As show in FIG. 5, PCB 122 may be mounted on spine assembly 120. In particular, PCB 122 may include one or more openings 123 configured to receive one or more clips 121 of a semi-cylindrical portion 125 of spine assembly 120. Spine assembly 120 may further include a microphone capsule 126, such as an electret capsule. Capsule 126 may be configured to convert sound waves into electrical signals. In particular, capsule 126 may include a flexible diaphragm and an insulated electrode referred to as a backplate. The diaphragm and backplate form the two plates of a capacitor, which, in the absence of a sound wave, will have a very small but definite capacitance. When a sound wave displaces the diaphragm, the capacitance will either be increased above or reduced below a resting value; depending upon whether the sound wave pushes the diaphragm toward the backplate or causes it to bow out away from the backplate.

Capsule 126 also may include an arrangement of field effect transistors to, for example, achieve low noise. In addition, capsule 126 may be electrically connect to one or more audio interface/port, such as analog port 10 and/or digital port 112, via PCB 122. More specifically, as shown, capsule 126 may couple with PCB 122 via one or more wires 127 passing through an aperture 129 of one or more clips 121. The audio interfaces/ports of PCB 122 may facilitate transmitting audio signals, such as analog or digital frequencies to, for example, a host device such as a camera, computer, table, or mobile device.

FIG. 6 illustrates an exemplary system 200 including microphone 100. As shown, microphone 100 may be coupled with a camera 128 via a mount 130. Mount 130 may be a suspension shock mount with shoe adaptor 132 for mounting microphone 100 onto camera 128 via a hot/cold shoe 134. Mount 130 also may include an integrated cable management clip. As illustrates, in an exemplary operation, microphone 100 may connected with camera 128 via a wired connection 129 through, for example, analog port 110. Once connected, capsule 126 of microphone 100 may be powered (such as via a 2-5V DC power that most cameras provide) and output an audio signal to camera 128 through analog port 110, as detailed below.

FIGS. 7A-7D illustrates an exemplary circuit 200 of microphone 100. Circuit 200 may include one or more semiconductors, such as a Complementary Metal Oxide-Semiconductor (CMOS). As shown, circuit 200 may includes a first switching circuit 202 and a second switching circuit 204. In addition, circuit 200 may include a USB connector 206, processing circuitry 208 including a codec 210, thin film resistors 212, a power supply 214, and a programming header 216.

Figure 7A:
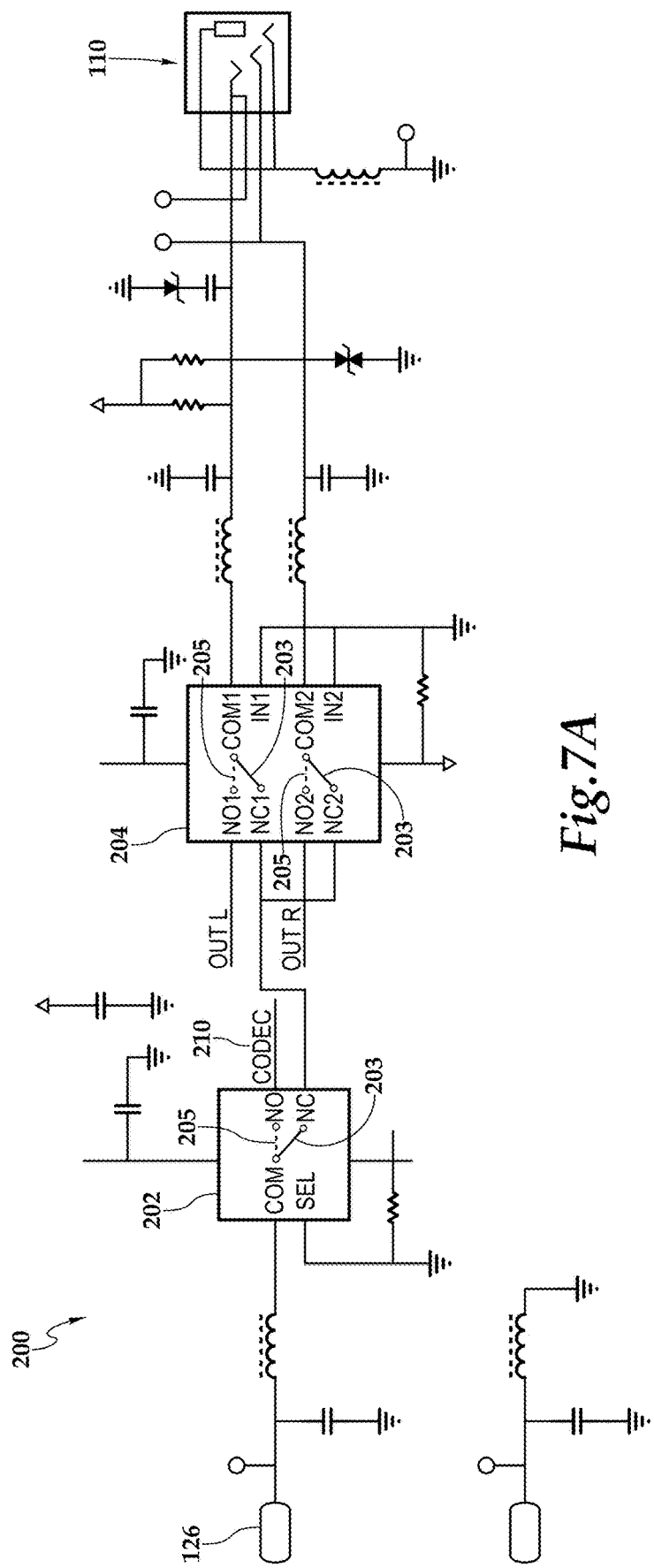
FIGS. 7A-7D illustrate an exemplary microphone circuit configuration.

As illustrated in FIG. 7A, both switching circuits 202, 204 may be, by default, in a normally closed ("NC") configuration 203. This default configuration 203 corresponds to connection of microphone 100 to a host device via analog port 110, which may be a 3.5 mm TRS port. Specifically, in the default configuration, capsule 126 of microphone 100 may be powered by "plug-in power," which may be a standard 2-5 volt DC power that is provided from the host device to microphone 100 through, for example, a 3.5 mm input as a biasing voltage.

As shown in FIG. 7A, when switching circuits 202, 204 are in a normally closed configuration 203, circuit 200 is configured to route an audio signal directly from capsule 126 to analog port 110. In other words, in the default configuration, power is passed from the host device through the analog port 110 directly to the capsule 126, and an audio signal is passed back from the capsule 126 to the host device via the analog port.

Figure 7B:
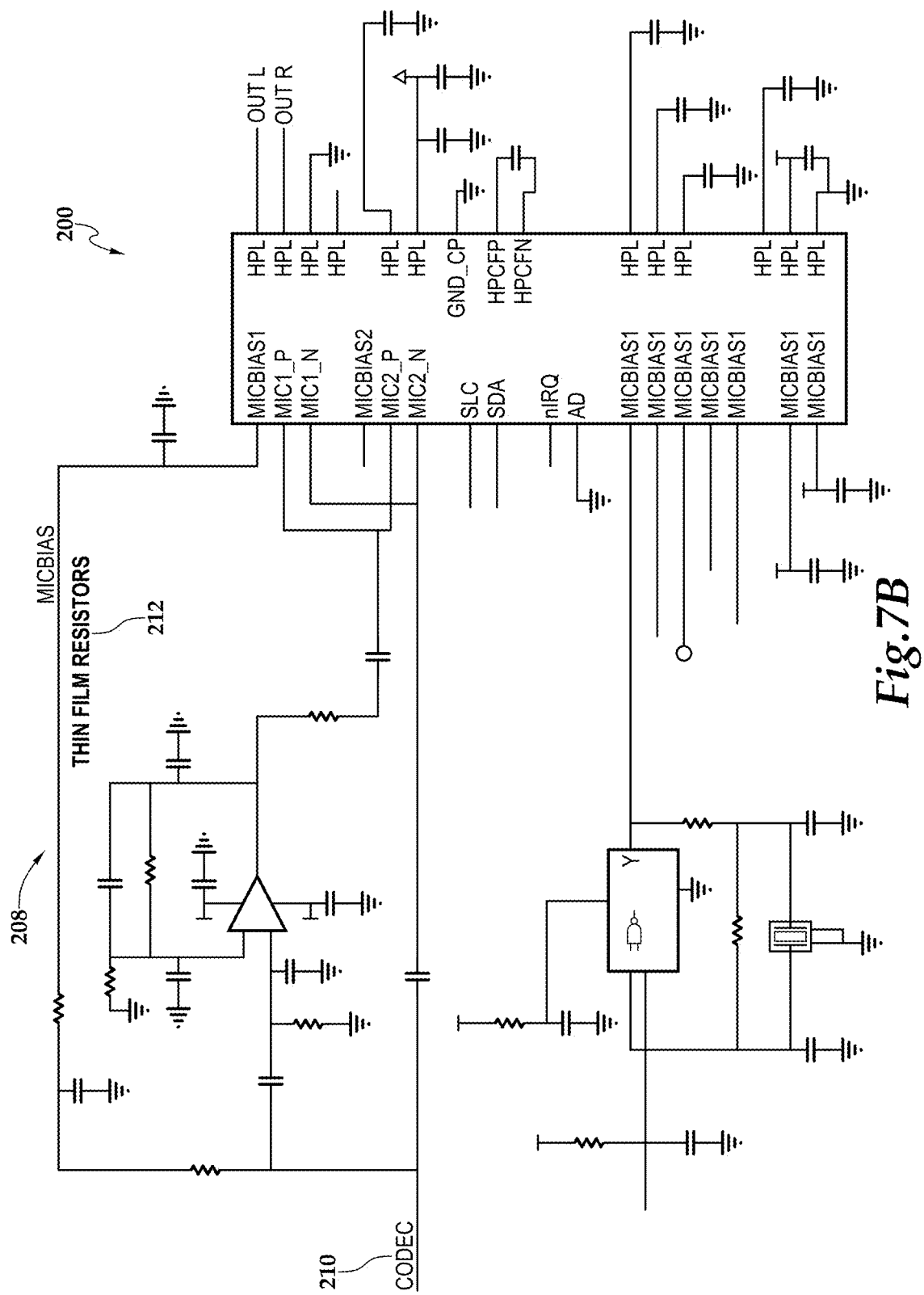
Figure 7C:
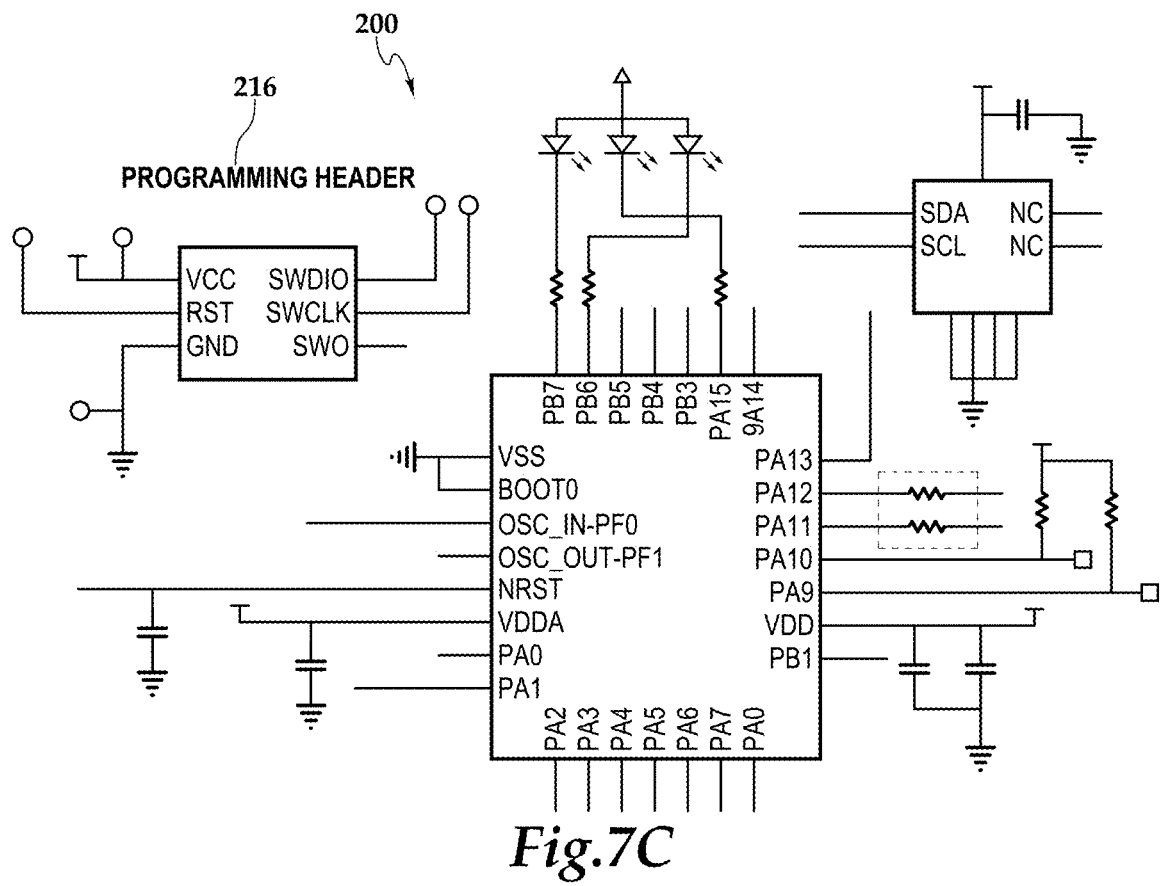
Figure 7D:
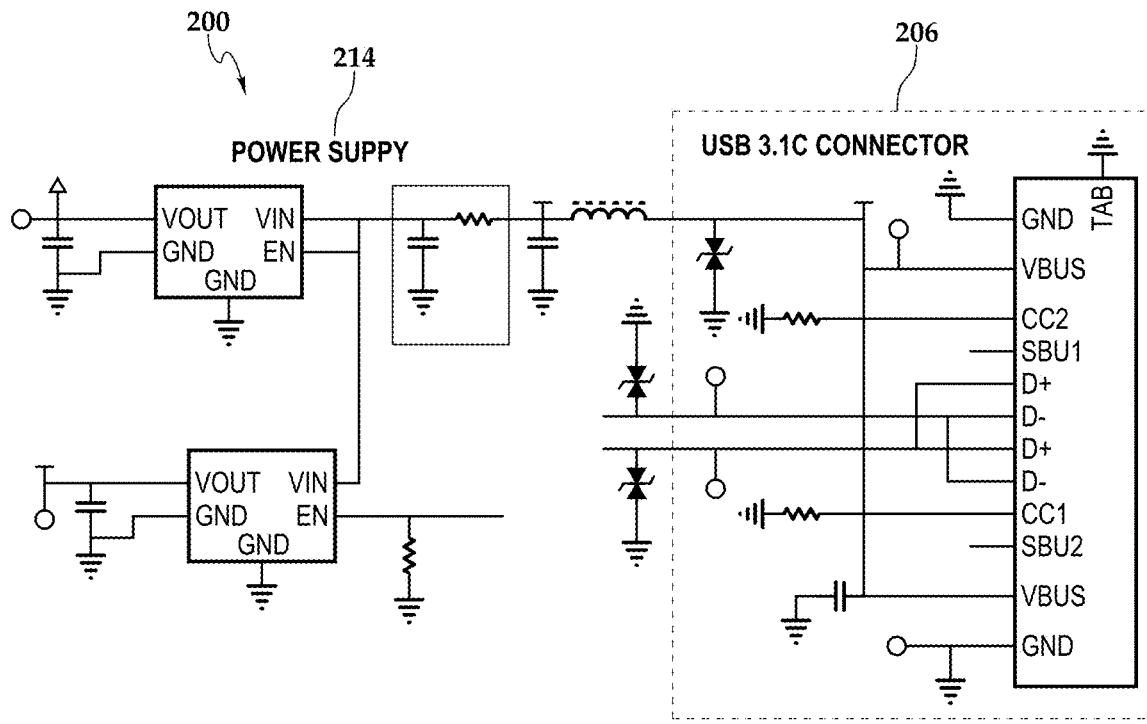

Upon detecting that microphone 100 is connected to a host device via digital port 112, such as UBS connector 206 (FIG. 7D), the state of first switching circuit 202 and second switching circuit 204 may be changed from the default configuration 203 (i.e., normally closed) to a normally open ("NO") configuration 205. In the normally open configuration 205, a separate capsule biasing voltage may be generated and applied directly to the capsule as there is no plugin-power present. In addition, in the normally open configuration 205, audio signals are routed from capsule 126 to processing circuitry 208. As shown in FIG. 7B, processing circuitry 208 may include a codec 210 configured to process an audio signal. Codec 210 may include a digital signal processor (DSP) and an analog-to-digital (ADC) and digital-to-analog (DAC) converters.

Moreover, in the normally open configuration 205, once an audio signal is processed via codec 210, circuit 200 is configured to route the processed audio signal through digital port 112 (e.g., USB connector 206) to the host device. In addition, in the normally open configuration, the analog port 110 may be configured to output audio to another device, such as a headphone. In other words, microphone 100 may be configured to simultaneously output an audio signal via the analog port 110 to a headphone and via the digital port 112 to a host device. In the normally open configuration 205, analog port 110 may output a processed audio signal from the processing circuit 208 to, for example, provide a high-level output for a used as compared to a direct audio signal from capsule 126.

Figure 8:
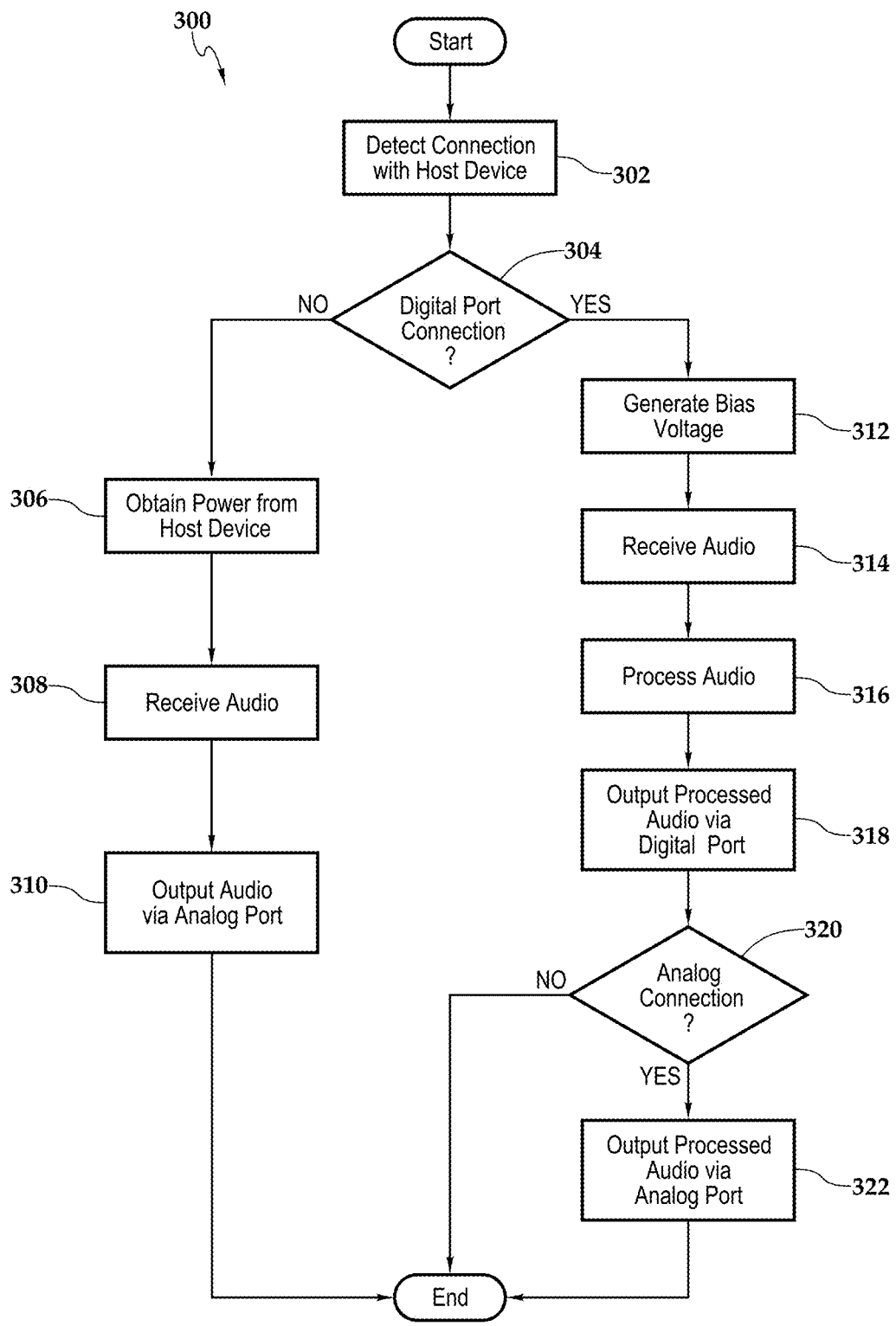
FIG. 8 is a flowchart illustrating an exemplary operation for selectively routing an audio signal.

FIG. 8 is a flowchart 300 illustrating the steps of an exemplary operation of microphone 100. The operation begins and, in step 302, microphone 100 detects a connection with a host device, such as a camera, computer, mobile device, and the like. In decision step 304, microphone 100 will determine whether the connection is through a digital port 112, such as a USB.

If at decision step 304, the connection is not through digital port 112, in step 306, capsule 126 of microphone 100 will obtain power from the host device via analog port 110. In step 308, capsule 126 is configured to receive audio and, in step 310, the audio will be routed directly to analog port 110.

If at decision step 304, the connection is through digital port 112, in step 312, a biasing voltage is generated and applied to capsule 126. In step 314, capsule 126 is configured to receive audio. In step 316, the audio is routed to processing circuitry 208 to enhance the sound and performance of the audio. In step 318, microphone 100 is configured to output the processed audio via digital port 112.

In decision step 320, microphone 100 will determine whether there is a connection via analog port 110. If yes, in step 322, microphone also may output audio via analog port 110 to, for example, a headphone. The audio output via analog port 110 may be processed and/or enhanced by processing circuitry 208 of microphone 100 or by the host device. For example, microphone 100 may be configured to simultaneously output audio to a headphone and to a camera.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described in the application are to be taken as examples of embodiments. Components may be substituted for those illustrated and described in the application, parts and processes may be reversed, and certain features of the invention may be utilized independently, all as would be apparent to one skilled in the art after having the benefit of this description of the invention. Changes may be made in the elements described in the application without departing from the spirit and scope of the invention as described in the following claims.

The invention claimed is:

1. A microphone comprising:
   a capsule configured to receive an audio signal;
   an analog port;
   a digital port electrically connected to processing circuitry, wherein said analog port and said digital port are arranged to face opposing directions on a printed circuit board mounted on a semi-cylindrical portion of a spine assembly, said printed circuit board including one or more openings shaped to receive one or more clips extending upwardly from said semi-cylindrical portion, wherein one or more wires pass through an aperture in the one or more clips for coupling said capsule to said printed circuit board;
   a switching circuit electrically connected to the capsule, said analog port, and said processing circuitry for selectively routing said audio signal;
   wherein said switching circuit, in a normally closed position, is configured to route said audio signal directly to said analog port; and
   wherein said switching circuit, in a normally open position, is configured to route said audio signal to said processing circuitry, said circuitry configured to process and route said audio signal to least one of said analog port and said digital port.

2. The microphone of claim 1, wherein said analog port is a 3.5 mm audio jack.

3. The microphone of claim 1, wherein said digital port is a USB interface.

4. The microphone of claim 1, wherein a bias voltage is generated and applied to said capsule when said switching circuit is in said normally closed position.

5. The microphone of claim 1, wherein said capsule is configured to obtain power from a host device via said analog port.

6. The microphone of claim 5, wherein, in response to detecting a connection via the digital port, said switching circuit is configured to switch to said normally open position.

7. The microphone of claim 1, wherein said processing circuitry comprises an analog-to-digital (ADC) converter and a digital-to-analog (DAC) converter.

8. The microphone of claim 1, wherein said processed audio signal is routed to both said digital port and said analog port.

9. The microphone of claim 1, wherein said audio signal is simultaneously output to a headset via said analog port and to said host device via said digital port, and a biasing voltage is generated and applied to said capsule via said digital port.

10. The microphone of claim 1, wherein said processing circuitry is configured to route audio from the host device to said analog port.

11. A method for switching the path of an audio signal in a microphone, the method comprising:
connecting a host device to said microphone, said microphone including an analog port and a digital port, wherein said analog port and said digital port are arranged to face opposing directions on a printed circuit board mounted on a semi-cylindrical portion of a spine assembly, said printed circuit board including one or more openings shaped to receive one or more clips extending upwardly from said semi-cylindrical portion of said spine assembly, wherein one or more wires pass through an aperture in the one or more clips for coupling said printed circuit board to a capsule;
receiving an audio signal via said microphone, said microphone including a default configuration for routing said audio signal to said analog port; and
switching the default configuration, upon detection of a connection of the host device to said digital port, such that said audio signal is processed via processing circuitry for output.

12. The method of claim 11, wherein said connecting step further comprising powering the microphone.

13. The method of claim 12, wherein said powering step includes generating and applying a bias voltage via said digital port.

14. The method of claim 12, wherein said powering step includes obtaining power from the host device when said microphone is in said default configuration.

15. The method of claim 11, wherein said switching step further includes closing a normally open switch in response to detecting the connection of the host device via said digital port.

16. The method of claim 11, wherein said processing circuitry is configured to process said audio signal via an analog-to-digital (ADC) converter and a digital-to-analog (DAC) converter.

17. The method of claim 11, further comprising routing audio from the host device to said analog port.

18. The method of claim 11, further comprising routing said processed audio signal to both said digital port and said analog port.

19. The method of claim 18, wherein said routing step further includes outputting said processed audio signal to a headset via said analog port.

20. The method of claim 18, wherein said routing step further includes outputting said processed audio signal to the host device via said digital port.

* * * * *